(12) United States Patent
Kim et al.

(10) Patent No.: US 9,076,549 B2
(45) Date of Patent: Jul. 7, 2015

(54) SEMICONDUCTOR MEMORY DEVICE AND REFRESH METHOD THEREOF

(71) Applicant: Samsung Electronics Co., Ltd., Suwon-si (KR)

(72) Inventors: Dae Jeong Kim, Seoul (KR); Kab Yong Kim, Suwon-Si (KR); Kwang Woo Lee, Suwon-Si (KR); Heon Lee, Hwaseong-si (KR); In Ho Cho, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/213,566

(22) Filed: Mar. 14, 2014

(65) Prior Publication Data

US 2014/0269123 A1    Sep. 18, 2014

(30) Foreign Application Priority Data

Mar. 15, 2013    (KR) .......................... 10-2013-0028268

(51) Int. Cl.
*G11C 11/406* (2006.01)
*G11C 29/00* (2006.01)

(52) U.S. Cl.
CPC .......... *G11C 11/40618* (2013.01); *G11C 29/70* (2013.01); *G11C 11/40603* (2013.01); *G11C 2211/4061* (2013.01); *G11C 29/783* (2013.01)

(58) Field of Classification Search
CPC .......... G11C 11/406; G11C 11/40603
USPC .................................. 365/200, 222
See application file for complete search history.

(56) References Cited

U.S. PATENT DOCUMENTS

| 6,166,972 | A  |   | 12/2000 | Hidaka |
|-----------|----|---|---------|--------|
| 6,590,815 | B2 |   | 7/2003  | Mine |
| 6,603,694 | B1 | * | 8/2003  | Frankowsky et al. ......... 365/222 |
| 6,851,017 | B2 |   | 2/2005  | Horiguchi et al. |
| 6,944,074 | B2 |   | 9/2005  | Chung et al. |
| 6,967,878 | B2 |   | 11/2005 | Dono |
| 7,046,561 | B1 | * | 5/2006  | Tooher .......................... 365/201 |
| 7,269,085 | B2 |   | 9/2007  | Sohn et al. |
| 7,301,844 | B2 |   | 11/2007 | Dono et al. |
| 7,397,719 | B2 |   | 7/2008  | Takahashi et al. |

(Continued)

FOREIGN PATENT DOCUMENTS

| JP | 3736779 B2 | 9/1999 |
| JP | 11-306753  | 11/1999 |

(Continued)

*Primary Examiner* — Hoai V Ho
*Assistant Examiner* — Jay Radke
(74) *Attorney, Agent, or Firm* — Muir Patent Law, PLLC

(57) ABSTRACT

A semiconductor memory device includes: a normal memory cell block including a first plurality of memory cells; a redundancy memory cell block including a second plurality of memory cells and configured for use in replacing memory cells of the normal memory cell block; a weak cell information storage configured to store information regarding weak memory cells in the normal and redundancy memory cell blocks; and a refresh control circuit configured to control a refresh rate of memory cells in the normal and redundancy memory cell blocks based on the information regarding weak memory cells in the weak cell information storage. The weak memory cells in the normal and redundancy memory cell blocks are refreshed at least once more than other memory cells in the normal and redundancy memory cell blocks during a refresh cycle.

17 Claims, 16 Drawing Sheets

(56) References Cited

U.S. PATENT DOCUMENTS

| | | |
|---|---|---|
| 7,688,655 B2 | 3/2010 | Takai |
| 7,719,906 B2 | 5/2010 | Tanimura et al. |
| 8,072,827 B2 | 12/2011 | Wakimoto |
| 2004/0141384 A1* | 7/2004 | Keeth et al. ............ 365/200 |
| 2005/0270862 A1* | 12/2005 | Cowles et al. ........... 365/200 |
| 2008/0031068 A1* | 2/2008 | Yoo et al. ............... 365/222 |
| 2009/0024884 A1* | 1/2009 | Klein ...................... 714/718 |
| 2013/0282973 A1* | 10/2013 | Kim et al. ............... 711/106 |
| 2015/0026537 A1* | 1/2015 | Romanovskyy et al. ..... 714/764 |

FOREIGN PATENT DOCUMENTS

| | | |
|---|---|---|
| JP | 2001-060400 | 3/2001 |
| JP | 2007-510254 A | 4/2007 |

* cited by examiner

FIG. 4

| FB1 | M1 | PRT1 | BA2 | BA1 | BA0 | RA12 | RA11 | RA10 | RA9 | RA8 | RA7 | RA6 | RA5 | RA4 | RA3 | RA2 | RA1 | RA0 | 410 |
| FB2 | M2 | PRT2 | BA2 | BA1 | BA0 | ✗ | ✗ | ✗ | ✗ | RA8 | RA7 | RA6 | RA5 | RA4 | RA3 | RA2 | RA1 | RA0 | |
| ... | | | | | | | | | | | | | | | | | | | |
| FBn | Mn | PRTn | BA2 | BA1 | BA0 | | | | | | | | | | | | | | |

SEMICONDUCTOR MEMORY DEVICE AND REFRESH METHOD THEREOF

CROSS-REFERENCE TO RELATED APPLICATIONS

This application claims the benefit of Korean Patent Application No. 10-2013-0028268, filed on Mar. 15, 2013, in the Korean Intellectual Property Office, the disclosure of which is incorporated herein in its entirety by reference.

BACKGROUND

The inventions relate to semiconductor memory devices, and more particularly, to a semiconductor memory device that requires a refresh operation and that includes a redundancy memory cell.

A semiconductor memory device such as a dynamic random access memory (DRAM) may be considered to be an inferior product when just one memory cell in the device is defective. However, it is inefficient to discard all the memory devices that have one or more defective memory cells in terms of the yield (the percentage of devices obtained from a wafer that perform acceptably). To address this problem, redundancy memory cells are often included in a semiconductor memory device, and a defective memory cell can be replaced with one of the redundancy memory cells, thereby improving the yield.

Not all memory cells in a device such as a DRAM have identical operating characteristics. Some memory cells can be considered weak because they may, especially under some operating conditions, require more frequent refreshing than non-weak cells to ensure proper data retention.

A semiconductor memory device may perform a refresh leveraging operation to improve the data retention characteristics of weak memory cells. When the refresh leveraging operation is applied to the semiconductor memory device, the weak memory cells may be refreshed more frequently than other memory cells.

However, because generally in a memory system with redundancy cells the refresh leveraging operation is limited to weak memory cells among non-redundancy memory cells (sometimes referred to as the "normal" or "primary" memory cells), there is a need to develop designs and methods of improving not only the performance of the normal or primary memory cells but also the performance of the redundancy memory cells in order to maximize the yield.

SUMMARY

According to aspects of the inventions, an embodiment of a semiconductor memory device comprises a normal memory cell block including a first plurality of memory cells, a redundancy memory cell block including a second plurality of memory cells and configured for use in replacing memory cells of the normal memory cell block, a weak cell information storage configured to store information regarding weak memory cells in the normal and redundancy memory cell blocks, and a refresh control circuit coupled to the normal and redundancy memory cell blocks and to the weak cell information storage. The refresh control circuit is configured to control a refresh rate of memory cells in the normal and redundancy memory cell blocks based on the information regarding weak memory cells in the weak cell information storage. The weak memory cells in the normal and redundancy memory cell blocks may be refreshed at least once more than other memory cells in the normal and redundancy memory cell blocks during a refresh cycle.

According to other aspects, a semiconductor memory device embodiment includes a weak cell information storage that comprises a plurality of fuses configured to store weak memory cell information entries. The weak memory cell information entry comprises a first field indicating whether the weak memory cell is in the normal memory cell block or the redundancy memory cell block and a second field indicating an address of the weak memory cell.

According to still other aspects, the plurality of fuses may comprise a plurality of anti-fuses. A mode register circuit may be coupled to the refresh control circuit, and the refresh control circuit may be configured to cause a refresh of a weak memory cell based on a specific value of the mode register circuit.

According to yet still other aspects, a semiconductor memory device may further include a repair cell information storage coupled to the refresh control circuit. The repair cell information storage may be configured to store information corresponding to memory cells among the normal memory cell block replaced by memory cells in the redundancy memory cell block.

According to various other aspects, the refresh control circuit may further include an address controller configured to control outputting of address information based on a comparison of address information obtained using the repair cell information storage with address information obtained using the weak cell information storage. The address controller may include a comparator, an address control unit, and an address storage configured to receive and store address information corresponding to memory cells obtained from the repair cell information storage. The comparator may be configured to compare the address information corresponding to repair memory cells obtained from the address storage with the address information corresponding to weak memory cells obtained from the weak cell information storage, and to output the comparison result. The address control unit may be configured to block outputting of the address information when the address information corresponding to a repair memory cell and the address information corresponding to a weak memory cell are the same. According to yet other various aspects, the refresh control circuit may be configured to control an automatic refresh operation of the semiconductor memory device.

Advantageously from perspectives such as performance and reliability, a computer system or other electronic device for which dynamically refreshed memory is an important component may include embodiments of semiconductor memory devices as in the foregoing embodiments.

In other various embodiments, a semiconductor memory device may include a first plurality of memory cells, a second plurality of memory cells configured for use in replacing memory cells of the first plurality of memory cells, a repair cell information storage configured to store information regarding memory cells in the first plurality of memory cells replaced by memory cells in the second plurality of memory cells, a weak cell information storage configured to store information regarding weak memory cells in the first and second plurality of memory cells, and a refresh control circuit coupled to the repair cell information storage, the weak cell information storage, and the first and second plurality of memory cells. The refresh control circuit is configured to control a refresh rate of memory cells in the first and second memory plurality of memory cells based on the information regarding weak memory cells in the weak cell information storage. During a refresh cycle, the weak memory cells are refreshed at least once more than other memory cells in the first and second plurality of memory cells.

In other various embodiments, the weak cell information storage comprises a plurality of fuses configured to store weak memory cell information entries identifying addresses of the weak memory cells. The plurality of fuses may comprise a plurality of anti-fuses. The memory device may further include a mode register circuit coupled to the refresh control circuit. The refresh control circuit may be configured to cause a refresh of a weak memory cell based on a specific value of the mode register circuit.

In still other various embodiments, the refresh control circuit further includes an address controller configured to control outputting of address information based on a comparison of address information obtained using the repair cell information storage with address information obtained using the weak cell information storage. The address controller may include an address storage configured to receive and store address information corresponding to memory cells obtained from the repair cell information storage and a comparator configured to compare the address information corresponding to repair memory cells obtained from the address storage with the address information corresponding to weak memory cells obtained from the weak cell information storage.

In yet still other various embodiments, a method is provided for operating a semiconductor memory device having a first plurality of memory cells, a second plurality of memory cells configured for use in replacing memory cells of the first plurality of memory cells, a weak cell information storage configured to store information regarding weak memory cells in the first and second plurality of memory cells, and a refresh control circuit. The method may include providing a refresh command to the refresh control circuit, determining an address value based on the refresh command, determining whether the address value corresponds to a memory cell in the first plurality of memory cells replaced by a memory cell in the second plurality of memory cells, determining whether the address value corresponds to a weak memory cell based on information from the weak cell information storage, and refreshing the memory cell corresponding to the address value more than once during a refresh cycle if the address value corresponds to the weak memory cell.

In still yet other various embodiments, a method of operating a memory device includes refreshing the memory cell corresponding to the address value more than once during the refresh cycle if the address value corresponds to the weak memory cell comprises utilizing a leveraging control signal generated based on information from the weak cell information storage. A method may further include receiving and storing address information corresponding to memory cells in the first plurality of memory cells replaced by memory cells in the second plurality of memory cells during a power-up operation of the semiconductor memory device.

In other embodiments, a method of operating the semiconductor memory device may include blocking an operation of the refresh control circuit when the address value determined based on the refresh command is the same as the stored address information. The method may further include blocking an operation of the refresh control circuit when an address information of the weak memory cells is the same as the stored address information.

BRIEF DESCRIPTION OF THE DRAWINGS

Exemplary embodiments of the inventions will be more clearly understood from the following detailed description taken in conjunction with the accompanying drawings in which:

FIG. 4 is a diagram illustrating information stored in a weak cell information storage unit of FIG. 3;

DETAILED DESCRIPTION OF THE EMBODIMENTS

Figure 1:
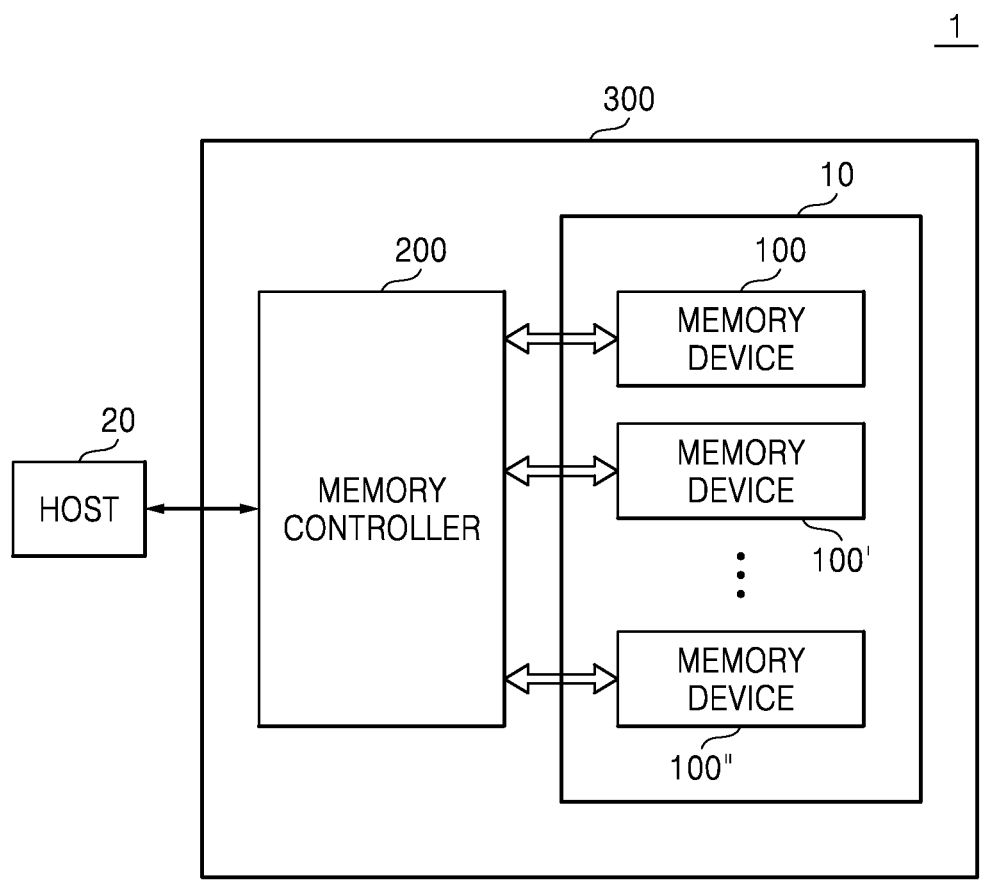
FIG. 1 is a schematic block diagram of an electronic system that incorporates embodiments of the inventions.

Embodiments of the inventions now will be described more fully hereinafter with reference to the accompanying drawings, in which various aspects of the invention are shown. The inventions may, however, be embodied in many different forms and should not be construed as limited to the embodiments set forth herein. Rather, these embodiments are provided so that this disclosure will be thorough and complete, and will fully convey the scope of the inventions to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including", or "have/has" and or "having", when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Referring now to FIG. 1, the electronic system 1 according to an embodiment of the inventive concept includes a host 20 and a memory system 300. The memory system 300 may include a memory controller 200 and a memory module 10.

The host 20 may communicate with the memory system 300 using an interface protocol such as peripheral component interconnect-express (PCI-E), advanced technology attachment (ATA), serial ATA (SATA), parallel ATA (PATA), or serial attached SCSI (SAS). However, the interface protocol between the host 20 and the memory system 300 is not limited thereto and may be another one such as a universal serial bus (USB) protocol, a multi-media card (MMC) protocol, an enhanced small disk interface (ESDI) protocol, and/or an integrated drive electronics (IDE) protocol, etc.

The memory controller 200 controls overall operations of the memory system 300, and exchange of various data between the host 20 and the memory module 10.

The memory module 10 may include semiconductor memory devices 100, 100', and 100". In the present disclosure, the semiconductor memory devices 100, 100', and 100" have been described as dynamic random access memories (DRAMs) each including a memory cell array (not shown) in which a plurality of memory cells are arranged in rows and columns, but the inventions are not limited thereto. Each of the semiconductor memory devices 100, 100', and 100" may be a memory of various types of memories that need to be refreshed.

When the semiconductor memory devices 100, 100', and 100" are DRAMs, the memory module 10 may be embodied as, for example, an unbuffered dual in-line memory module (UDIMM), a registered DIMM (RDIMM), or a load reduced (LR)-DIMM. The memory module 10 may further include a buffer (not shown) or a register (not shown).

The memory system 300 according to the present embodiment may be installed in a system such as a mobile device, a notebook computer, a desktop computer, etc. but is not limited thereto.

Figure 2:
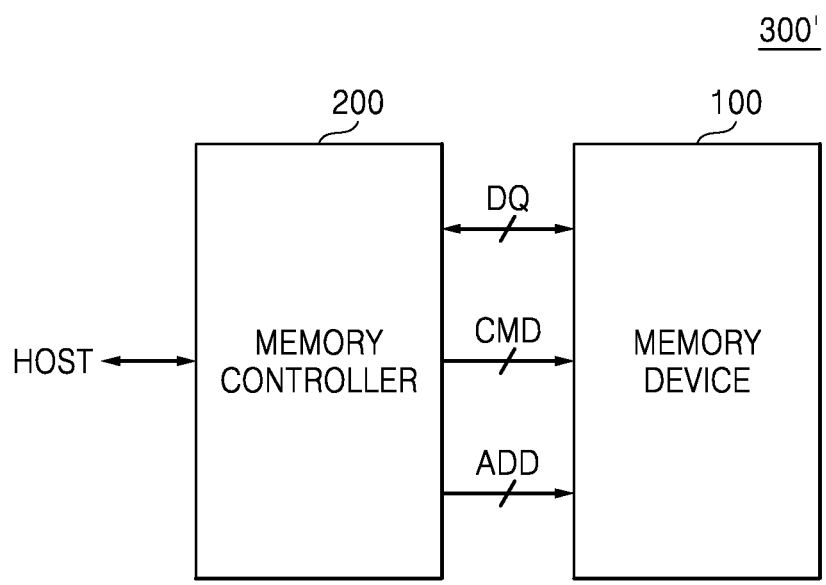
FIG. 2 is a schematic block diagram of a memory system according to an embodiment of the inventions.

FIG. 2 is a schematic block diagram of a memory system 300' according to an embodiment of the inventions. In the current embodiments, for illustration, the case in which only one semiconductor memory device 100 corresponds to a memory controller 200 will be described. Referring to FIG. 2, the memory controller 200 inputs data to the semiconductor memory device 100 or outputs data from the semiconductor memory device 100 via a data pin DQ, according to a request from a host 20.

The memory controller 200 may continuously perform an operation of applying an address signal ADD together with a command CMD for an active operation of the semiconductor memory device 100, an operation of applying the address signal ADD together with a command CMD for a write operation or a read operation, and an operation of applying the address signal ADD together with a command CMD for a refresh operation.

Figure 3:
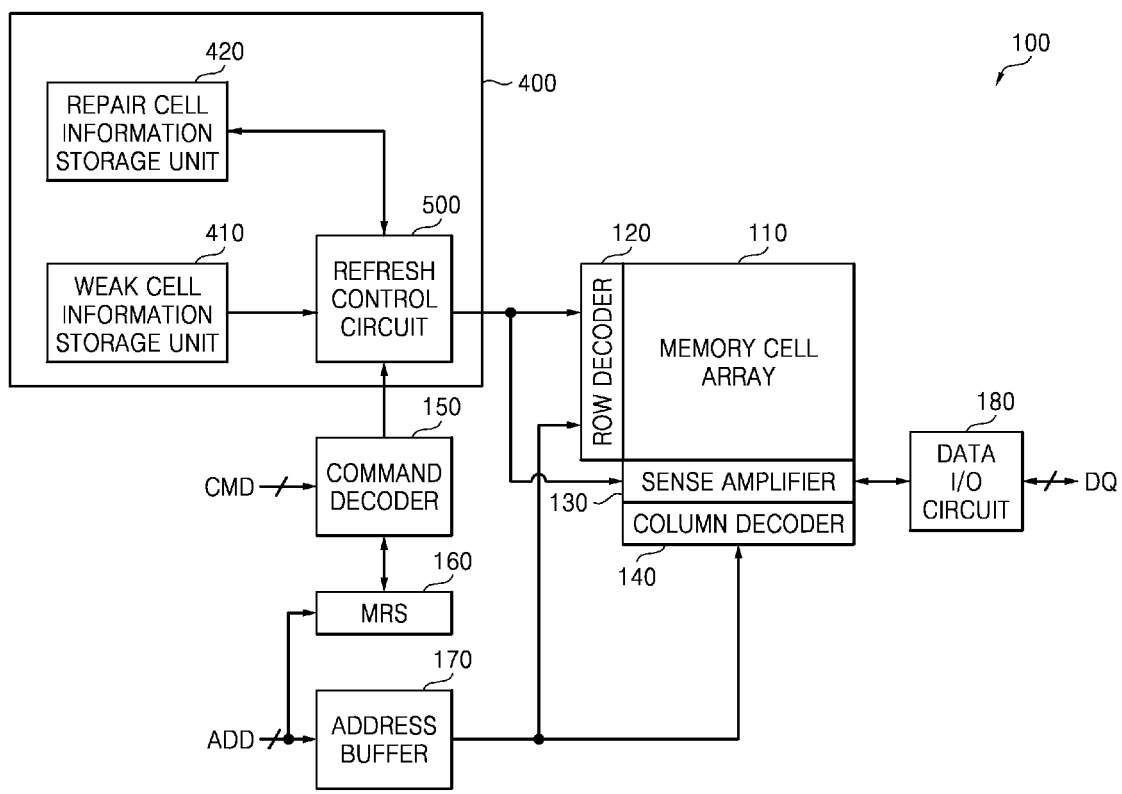
FIG. 3 is a block diagram of a semiconductor memory device according to an embodiment of the inventions.

Referring now to FIG. 3, the semiconductor memory device 100 exemplarily represents one of the plurality of semiconductor memory devices 100, 100', and 100" of FIG. 1. Device 100 includes a memory cell array 110, a row decoder 120, a sense amplifier 130, a column decoder 140, a command decoder 150, a mode register set/extended mode register set (MRS/EMRS) circuit 160, an address buffer 170, a data input/output (I/O) circuit 180, and control logic 400.

The memory cell array 110 may include a normal or primary memory cell block having a plurality of normal memory cells, and a redundancy memory cell block having a plurality of redundancy memory cells for replacing repair memory cells among the plurality of normal memory cells. In the normal memory cell block and the redundancy memory cell block, these memory cells may be arranged in a matrix of rows and columns.

In this example, the repair memory cells may be memory cells in which a defect is identified during test of the semiconductor memory device 100, and the addresses of the repair memory cells may be replaced with addresses of the redundancy memory cells (i.e., e.g., during operation, a memory access of an address of a defective "repair" cell in the normal or primary memory cell block is replaced with the address in the redundancy memory cell block).

The sense amplifier 130 senses and amplifies data stored in a memory cell, and also stores data in the memory cell.

Data input via the data I/O circuit 180 is written to the memory cell array 110 based on an address signal ADD. Data read from the memory cell array 110 based on an address signal ADD is output to the memory controller 200 via the data I/O circuit 180.

To designate a memory cell to or from which data will be written or read, the address signal ADD is input to the address buffer 170. The address buffer 170 temporarily stores an address signal ADD input by the memory controller 200.

The row decoder 120 decodes a row address from the address signal ADD output from the address buffer 170 so as to designate a word line connected to a memory cell which data is to be input to or output from. That is, the row decoder 120 decodes a row address output from the address buffer 170 and enables a corresponding word line in a data write or read mode. Also, the row decoder 120 refreshes a word line based on a row address generated by a refresh control circuit 500.

The column decoder 140 decodes a column address from the address signal ADD output from the address buffer 170 so as to designate a bit line connected to a memory cell which data is to be input to or output from.

The memory cell array 110 reads data from or writes data to the memory cell designated by the row address and the column address.

The command decoder 150 receives commands CMD applied from the memory controller 200, and decodes the commands CMD to internally generate decoded command signals, e.g., an active signal, a read signal, a write signal, a refresh signal, etc.

The MRS/EMRS circuit 160 sets an internal mode register according to an MRS/EMRS command for designating an operating mode of the semiconductor memory device 100 and the address signal ADD.

The control logic 400 may include a weak cell information storage unit 410, a repair cell information storage unit 420, and a refresh control circuit 500. The weak cell information storage unit 410 may store information regarding weak memory cells belonging to the normal memory cell block and information regarding weak memory cells belonging to the redundancy memory cell block. In this example, weak memory cells are memory cells having poorer data retention characteristics than normal memory cells and may thus benefit from being refreshed more often than the normal memory cells during a refresh cycle of the plurality of memory cells.

An example of the weak cell information storage unit 410 of FIG. 3 is illustrated in FIG. 4.

Referring to FIG. 4, the weak cell information storage unit 410 includes a plurality of fuse boxes FB1, FB2, . . . , FBn configured to store information entries corresponding to a plurality of weak memory cells. The plurality of fuse boxes FB1, FB2, . . . , FBn may be embodied as anti-fuses. Here, 'n' denotes a natural number.

Each of the information entries corresponding to the plurality of weak memory cells stored in the weak cell information storage unit 410 may include a master field M, a cell type field PRT, and address fields BA and RA. In this case, the master field M and the cell type field PRT may be each stored as a 1-bit value.

The master field M indicates whether address information corresponding to a weak memory cell is stored in a fuse box FB corresponding to the master field M, i.e., whether the fuse box FB is in use. For example, the master field M may be set to '0' when the address information corresponding to the weak memory cell is not stored in the fuse box FB, and may be set to '1' when the address information corresponding to the weak memory cell is stored in the fuse box FB.

The cell type field PRT indicates whether a weak memory cell is included in a "normal" memory cell block or a redundancy memory cell block. The address fields BA and RA may represent bank address information BA and row address information RA corresponding to the weak memory cell, respectively.

For example, when an information entry corresponding to a weak memory cell belonging to the normal memory cell block is stored in the first fuse box FB1, a cell type field PRT1 may be set to '0' and bank address information BA2 to BA0 and row address information RA12 to RA0 corresponding to the weak memory cell belonging to the normal memory cell block may be stored in the first fuse box FB1.

Also, when an information entry corresponding to a weak memory cell belonging to the redundancy memory cell block is stored in the second fuse box FB2, a cell type field PRT2 may be set to '1' and bank address information BA2 to BA0 and row address information RA8 to RA0 corresponding to the weak memory cell belonging to the redundancy memory cell block may be stored in the second fuse box FB2.

Referring back to FIG. 3, the repair cell information storage unit 420 may store address information corresponding to a repair memory cell among the plurality of normal memory cells included in the memory cell array 110.

The refresh control circuit 500 may control memory cells, which correspond to a refresh command decoded by the command decoder 150 among the plurality of normal memory cells and the plurality of redundancy memory cells, to be refreshed and control a weak memory cell to be refreshed based on at least one of the information regarding the weak memory cells belonging to the normal memory cell block and the information regarding the weak memory cells belonging to the redundancy memory cell block stored in the weak cell information storage unit 410, according to the refresh command.

In this case, during a refresh cycle of the plurality of normal memory cells, the refresh control circuit 500 may control a weak memory cell to be refreshed a larger number of times than normal memory cells.

The refresh control circuit 500 may control a weak memory cell to be additionally refreshed when a particular field of the MRS/EMRS circuit 160 is set to a specific value, and control the weak memory cell not to be additionally refreshed and only memory cells corresponding to a refresh address to be refreshed when the particular field of the MRS/EMRS circuit 160 is not set to the specific value.

Although not shown in FIG. 3, the semiconductor memory device 100 may further include a clock circuit (not shown) configured to generate a clock signal, a power supply circuit (not shown) configured to receive an external power supply voltage and generate or distribute an internal voltage.

Figure 5:
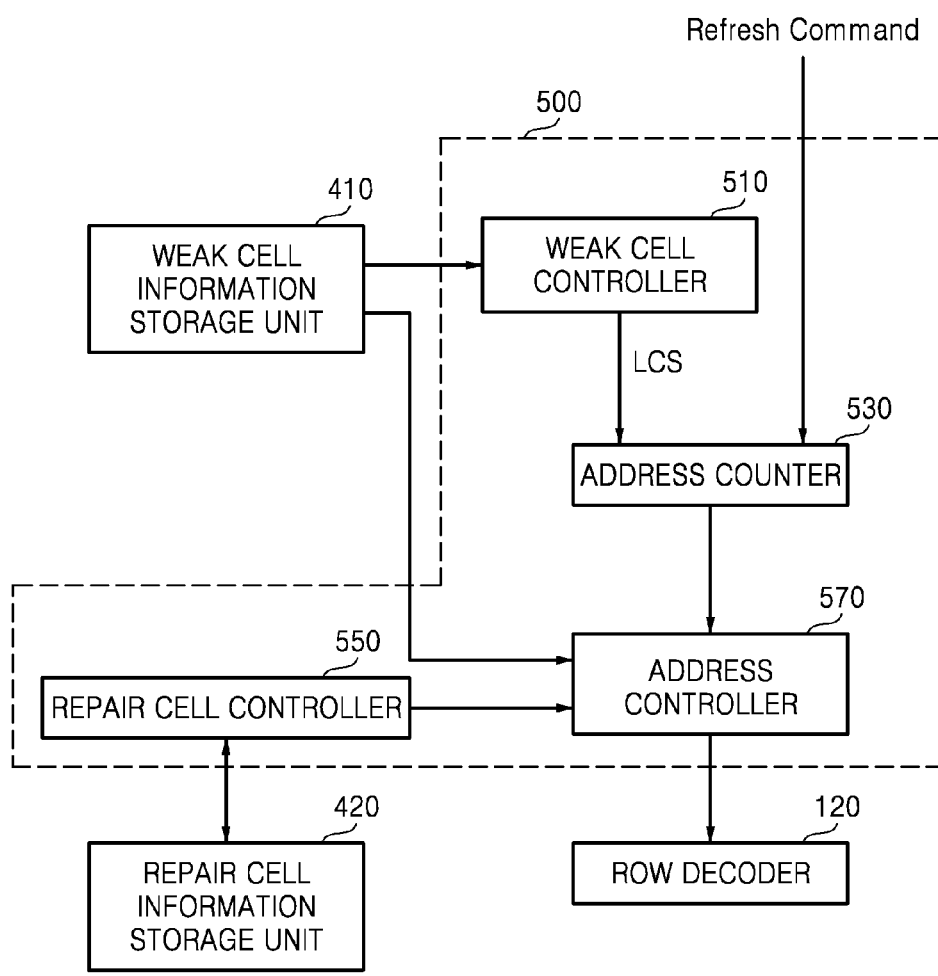
FIG. 5 is a block diagram of a refresh control circuit of FIG. 3.

Referring together to FIGS. 3 to 5, the refresh control circuit 500 may include a weak cell controller 510, an address counter 530, a repair cell controller 550, and an address controller 570.

The weak cell controller 510 may output a leveraging control signal (LCS) when address information is output from the weak cell information storage unit 410.

The address counter 530 may transmit address information corresponding to an address count value, that varies according to a refresh command, to the address controller 570 so that the plurality of normal memory cells and the plurality of redundancy memory cells included in the memory cell array 110 may be refreshed at predetermined time intervals.

Also, in this example, the address counter 530 temporarily stops an address counting operation when the leveraging control signal LCS is input thereto from the weak cell controller 510, and resumes the address counting operation starting from a point prior to a stopped point when the leveraging control signal LCS is not input and a refresh command is input thereto.

In this case, the refresh command may be applied from the command decoder 150 when the refresh control circuit 500 is driven in a CAS-Before-RAS (CBR) refresh operating mode. The CBR refresh operating mode may be understood as a refresh operation to be performed on the plurality of normal memory cells and the plurality of redundancy memory cells.

Also, when the refresh control circuit 500 is driven in a refresh leveraging operating mode, the address counter 530 may temporarily stop a CBR refresh operation according to the leveraging control signal LCS output from the weak cell controller 510. In this case, the refresh leveraging operating mode may be understood as a refresh operation to be performed on weak memory cells among the plurality of normal memory cells and the plurality of redundancy memory cells.

In other words, the plurality of normal memory cells and the plurality of redundancy memory cells may be refreshed in every predetermined refresh cycle of the plurality of normal memory cells, and weak memory cells among the plurality of normal memory cells and the plurality of redundancy memory cells may be additionally refreshed at least once during the predetermined refresh cycle. Thus, the data retention characteristics of the weak memory cells is improved, because the weak memory cells are refreshed a larger number of times than the other normal memory cells.

During a power-up operation of the semiconductor memory device 100, the repair cell controller 550 may output address information corresponding to one or more repair memory cells, which is transmitted from the repair cell information storage unit 420, to the address controller 570. The address controller 570 may store the address information corresponding to the repair memory cell(s), which is received from the repair cell controller 550.

The address controller 570 may compare address information corresponding to an address count value with address information corresponding to a repair memory cell, and control outputting of the address information corresponding to the address count value based on a comparison result.

Also, the address controller 570 may compare address information output from the weak cell information storage unit 410 with address information corresponding to a repair memory cell, and control outputting of the address information from the weak cell information storage unit 410 based on a comparison result.

Figure 6:
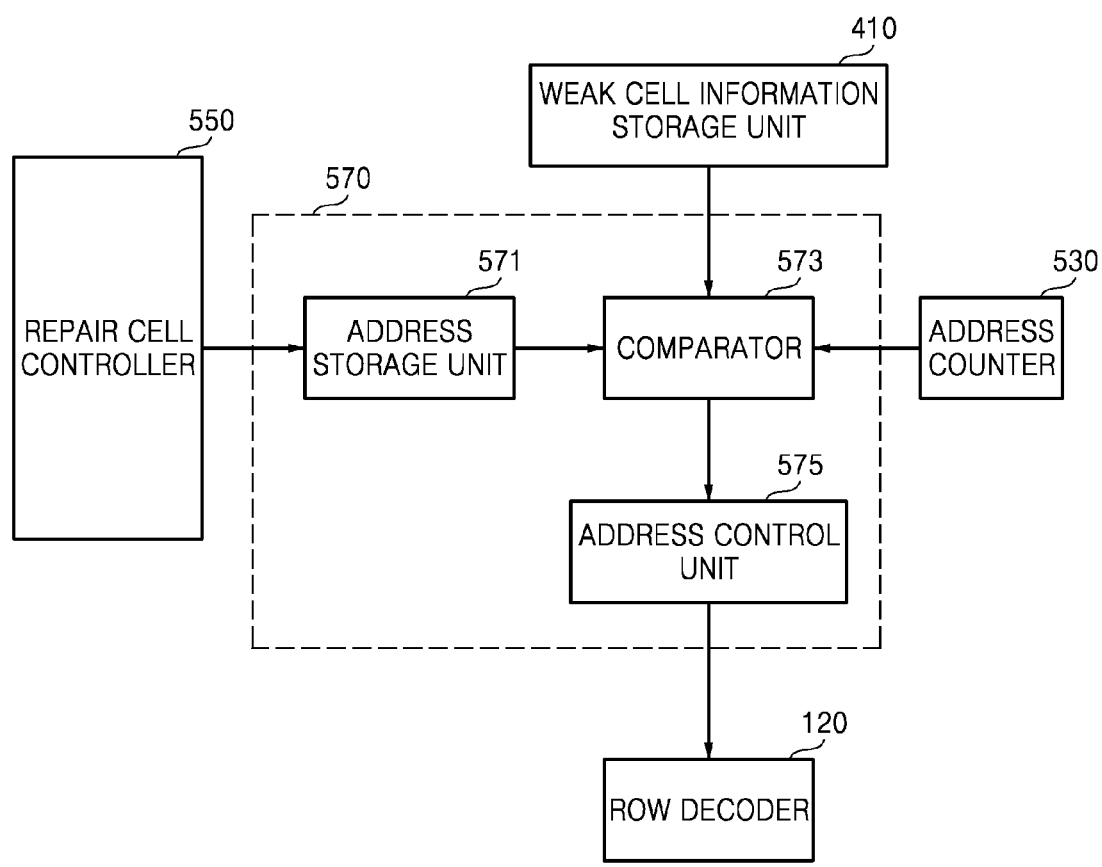
FIG. 6 is a block diagram of an address controller of FIG. 5.

FIG. 6 is a block diagram of the address controller 570 of FIG. 5. Referring to FIGS. 3 to 6, the address controller 570 may include an address storage unit 571, a comparator 573, and an address control unit 575.

The address storage unit 571 may receive and store address information corresponding to a repair memory cell, which is output from the repair cell information storage unit 420.

The comparator 573 may compare address information corresponding to an address count value, which is output from the address counter 530, with address information corresponding to a repair memory cell, which is output from the address storage unit 571, and then output a comparison result.

Also, the comparator 573 may compare address information corresponding to a weak memory cell, which is output from the weak cell information storage unit 410, with address information corresponding to a repair memory cell, which is output from the address storage unit 571, and then output a comparison result.

When the comparison result reveals that the address information corresponding to the address count value and the address information corresponding to the repair memory cell are not the same or the address information corresponding to the weak memory cell and the address information corresponding to the repair memory cell are not the same, the address control unit 575 may output the address information corresponding to the address count value or the address information corresponding to the weak memory cell to the row decoder 120.

However, when the comparison result reveals that the address information corresponding to the address count value and the address information corresponding to the repair memory cell are the same or the address information corresponding to the weak memory cell and the address information corresponding to the repair memory cell are the same, the address control unit 575 may control the address information corresponding to the address count value or the address information corresponding to the weak memory cell not to be output to the row decoder 120. In other words, a refresh operation may be skipped with respect to a repair memory cell replaced with a redundancy memory cell.

Figure 7:
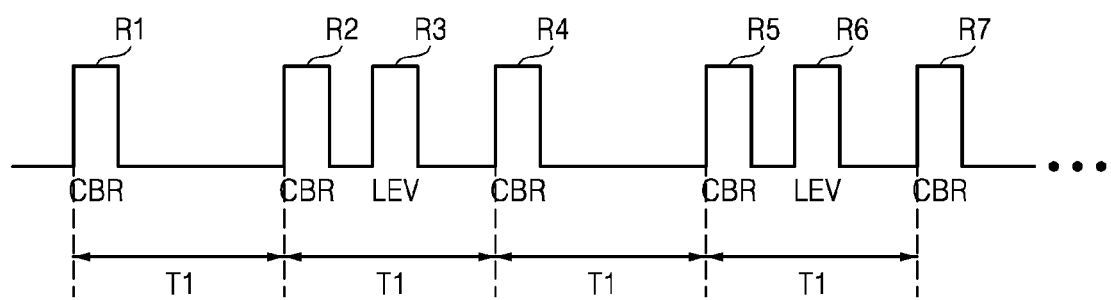
FIG. 7 is a timing diagram illustrating a refresh method performed on a semiconductor memory device according to an embodiment of the inventions.

FIG. 7 is a timing diagram illustrating a refresh method performed on a semiconductor memory device according to an embodiment of the inventions. In FIGS. 1 to 7, 'CBR' denotes a section in which a CBR refresh operation is performed on the semiconductor memory device 100, and 'LEV' denotes a section in which a refresh leveraging operation is performed on the semiconductor memory device 100. In this example, the CBR refresh operation may also be understood as an auto refresh operation of the semiconductor memory device 100.

The semiconductor memory device 100 may perform a refresh operation on the memory cells included in memory cell array 110 at predetermined time intervals T1 according to an externally received refresh command.

The predetermined time interval T1 means a time period between when a refresh command is generated and when a subsequent refresh command is generated, i.e., a time period between when a CBR refresh operation is performed and when a subsequent CBR refresh operation is performed. The refresh command may be repeatedly performed N times until refreshing of all the plurality of normal memory cells and the plurality of redundancy memory cells included in the memory cell array 110 is completed. Here, 'N' denotes a natural number. That is, a product of the predetermined time interval T1 and the natural number N may be a refresh cycle in which refreshing of all the memory cells is completed.

In this example, the refresh leveraging operation LEV may be performed after a CBR refresh operation is performed at least twice and before a subsequent CBR refresh operation is performed. Also, the refresh leveraging operation LEV may be performed at least once between a previous CBR refresh operation and a subsequent CBR refresh operation.

Although FIG. 7 illustrates a case in which the refresh leveraging operation LEV is performed once (section R3) after the CBR refresh operation is performed twice (sections R1 and R2) and before the CBR refresh operation is performed again (section R4), the inventions are not limited thereto and the refresh leveraging operation LEV (section R3) may, for example, be performed after the CBR refresh operation CBR is performed three times (sections R1, R2, and R4). In this case, a number of times that the refresh leveraging operation LEV is performed may vary according to a state of the semiconductor memory device 100 when the semiconductor memory device 100 is tested.

As described above, before the section R1 in which the CBR refresh operation is first performed, address information corresponding to a repair memory cell which is output from the repair cell information storage unit 420 may be stored in the address storage unit 571 beforehand.

For example, when in the sections R1, R2, R4, R5, and R7 in which the CBR refresh operation is performed, address information corresponding to a normal memory cell or a redundancy memory cell is the same as the address information stored in the address storage unit 571, refreshing of the address information corresponding to the normal memory cell or the address information corresponding to the redundancy memory cell may be skipped. In this case, the refresh control circuit 500 may perform a subsequent CBR refresh operation or perform a refresh leveraging operation LEV before the subsequent CBR refresh operation is performed.

On the other hand, when in the section R3 in which the refresh leveraging operation LEV is performed, address information stored in the first fuse box FB1 is the same as the address information stored in the address storage unit 571, refreshing of the address information stored in the first fuse box FB1 may be skipped. In this case, the refresh control circuit 500 may determine whether a refresh operation is to be performed on address information stored in the second fuse box FB2 and perform or skip the refresh operation, before a subsequent CBR refresh operation is performed.

Figure 8:
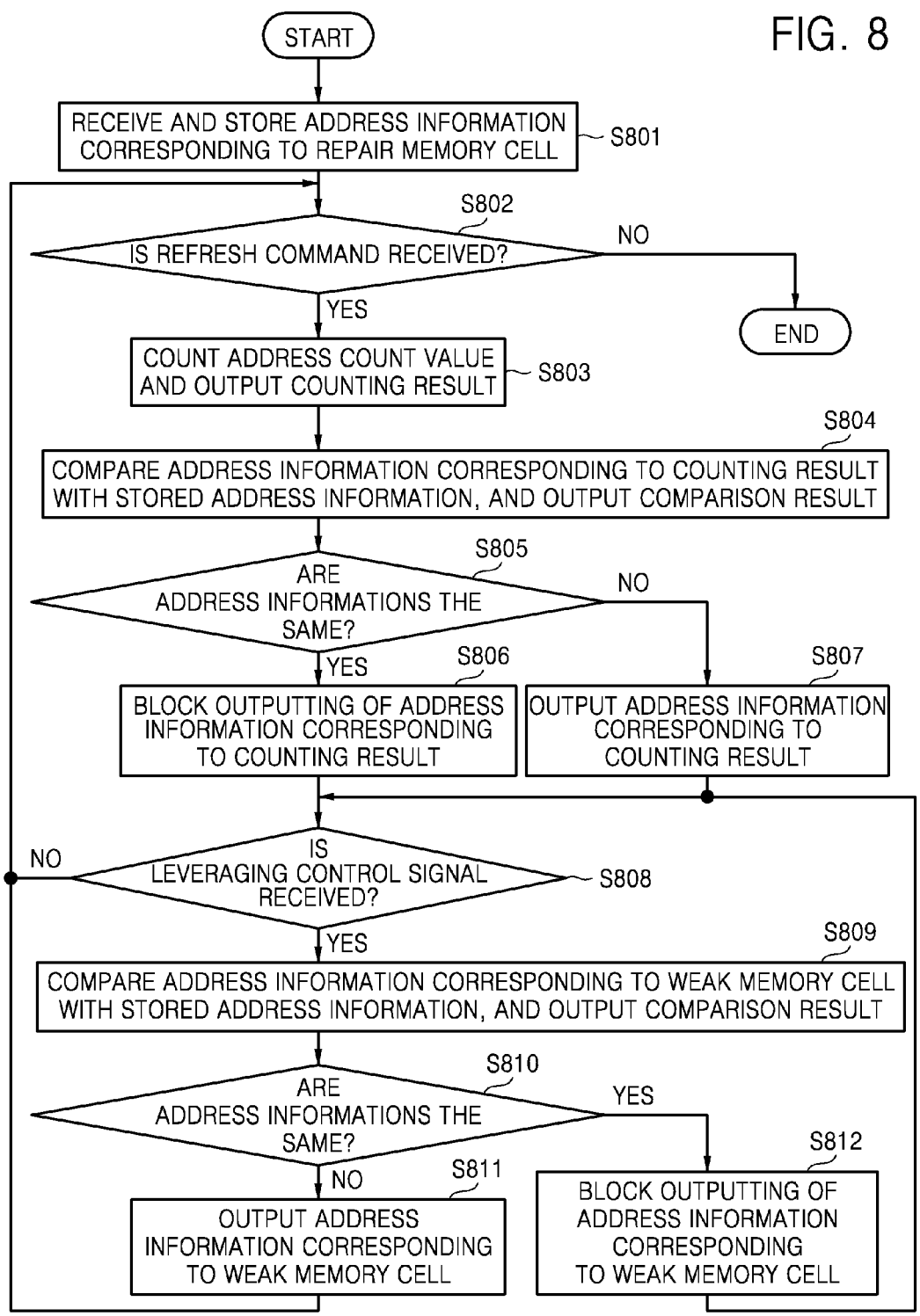
FIG. 8 is a flow chart illustrating a refresh method performed on a semiconductor memory device according to an embodiment of the inventions.

FIG. 8 is a flow chart illustrating a refresh method performed on a semiconductor memory device according to an embodiment of the inventions. Referring to FIGS. 1 to 8, during a power-up operation of the semiconductor memory device 100, the address storage unit 571 receives address information corresponding to a repair memory cell from the repair cell controller 550, and stores the address information (operation S801).

Then, the address counter 530 determines whether a refresh command is received (operation S802). When the refresh command is externally received, the address counter 530 counts an address count value and outputs address information corresponding to a counting result to the comparator 573 (operation S803).

Then, the comparator 573 compares the address information corresponding to the counting result, which is received from the address counter 530, with the address information stored in the address storage unit 571, and outputs a comparison result (operation S804).

Then, the address control unit 575 determines whether the address information corresponding to the counting result and the address information stored in the address storage unit 571 are the same, based on the comparison result (operation S805). When it is determined in operation 5805 that the address information corresponding to the counting result and the address information stored in the address storage unit 571 are the same, the address control unit 575 blocks outputting of the address information corresponding to the counting result (operation S806).

However, when it is determined in operation S805 that the address information corresponding to the counting result and the address information stored in the address storage unit 571 are not the same, the address control unit 575 outputs the address information corresponding to the counting result to the row decoder 120 (operation S807).

Then, the address counter 530 determines whether a leveraging control signal LCS is received from the weak cell controller 510 (operation S808). When it is determined in operation S808 that the leveraging control signal LCS is not received from the weak cell controller 510, the refresh control circuit 500 may perform operations S802 to S807.

However, when it is determined in operation S808 that the leveraging control signal LCS is received from the weak cell controller 510, the address counter 530 temporarily stops the address counting operation. Then, the comparator 573 compares address information corresponding to a weak memory cell, which is output from the weak cell information storage unit 410, and the address information stored in the address storage unit 571, and then outputs a comparison result (operation S809).

Then, the address control unit 575 determines whether the address information corresponding to the weak memory cell and the address information stored in the address storage unit 571 are the same, based on a comparison result (operation S810). When it is determined in operation S810 that the address information corresponding to the weak memory cell and the address information stored in the address storage unit 571 are not the same, the address control unit 575 outputs the address information corresponding to the weak memory cell to the row decoder 120 (operation S811).

However, when it is determined in operation S810 that the address information corresponding to the weak memory cell and the address information stored in the address storage unit 571 are the same, the address control unit 575 blocks outputting of the address information corresponding to the weak memory cell (operation S812).

When it is determined in operation S808 that the leveraging control signal LCS is not received from the weak cell controller 510 and it is determined in operation S802 that the refresh command is not received, it may be determined that refreshing of all the memory cells included in the memory cell array 110 is completed. That is, operations S802 to S812 are performed in a refresh cycle in which refreshing of all the memory cells is completed.

Figure 9:
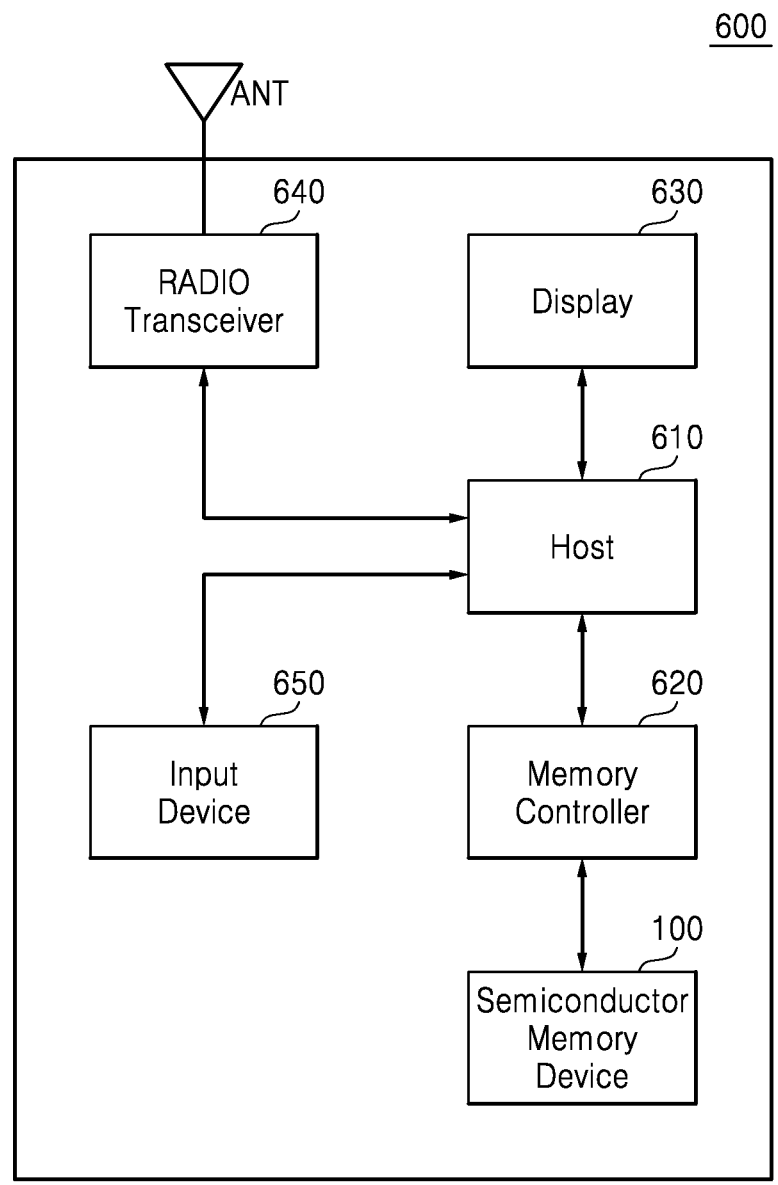
FIG. 9 is a block diagram of a computer system including the semiconductor memory device illustrated in FIG. 3 according to some embodiments of the inventions.

FIG. 9 is a block diagram of a computer system 600 including the semiconductor memory device 100 illustrated in FIG. 3 according to some embodiments of the inventions. Referring to FIG. 9, the computer system 600 may be implemented as a cellular phone, a smart phone, a tablet personal computer (PC), a personal digital assistant (PDA) or a radio communication system.

The computer system 600 includes the semiconductor memory device 100 and a memory controller 620 controlling the operations of the semiconductor memory device 100. The memory controller 620 may control the data access operations, e.g., a write operation, or a read operation, of the semiconductor memory device 100 according to the control of a host 610.

The page data programmed in the semiconductor memory device 100 may be displayed through a display 630 according to the control of the host 610 and the memory controller 620.

A radio transceiver 640 transmits or receives radio signals through an antenna ANT. The radio transceiver 640 may convert radio signals received through the antenna ANT into signals that can be processed by the host 610. Accordingly, the host 610 may process the signals output from the radio transceiver 640 and transmit the processed signals to the memory controller 620 or the display 630. The memory controller 620 may program the signals processed by the host 610 to the semiconductor memory device 100. The radio transceiver 640 may also convert signals output from the host 610 into radio signals and outputs the radio signals to an external device through the antenna ANT.

An input device 650 enables control signals for controlling the operation of the host 610 or data to be processed by the host 610 to be input to the computer system 600. The input device 650 may be implemented by, for example, a pointing device such as a touch pad or a computer mouse, a keypad, or a keyboard.

The host 610 may control the operation of the display 630 to display data output from the memory controller 620, data output from the radio transceiver 640, or data output from the input device 650. The memory controller 620, which controls the operations of the semiconductor memory device 100, may be implemented as a part of the host 610 or as a separate chip.

Figure 10:
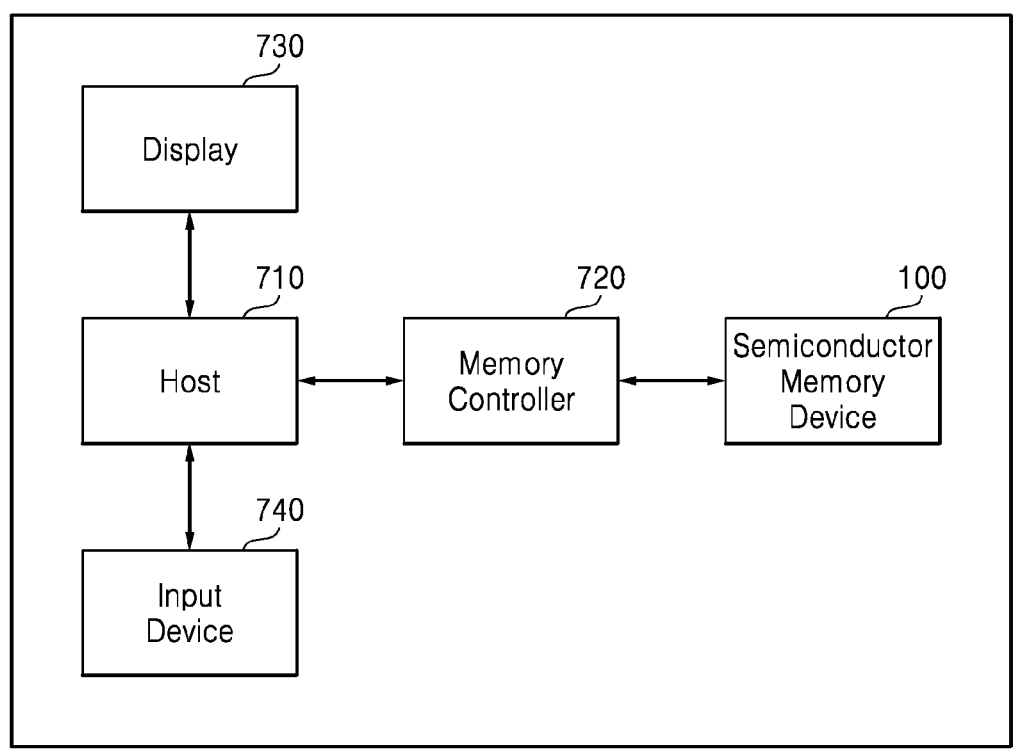
FIG. 10 is a block diagram of another computer system including the semiconductor memory device illustrated in FIG. 3 according to another embodiment of the inventions.

FIG. 10 is a block diagram of a computer system 700 including the semiconductor memory device 100 illustrated in FIG. 3 according to another embodiment of the inventions. The computer system 700 may be implemented as a personal computer (PC), a tablet PC, a netbook, an e-reader, a personal digital assistant (PDA), a portable multimedia player (PMP), an MP3 player, or an MP4 player, etc.

The computer system 700 includes a host 710, the semiconductor memory device 100, a memory controller 720 controlling the data processing operations of the semiconductor memory device 100, a display 730 and an input device 740. A host 710 may display data stored in the semiconductor memory device 100 through the display 730 according to data input through the input device 740. The input device 740 may be implemented by, for example, a pointing device such as a touch pad or a computer mouse, a keypad, or a keyboard.

The host 710 may control the overall operation of the computer system 700 and the operations of the memory controller 720. The memory controller 720, which may control the operations of the semiconductor memory device 100, may be implemented as a part of the host 710 or as a separate chip.

Figure 11:
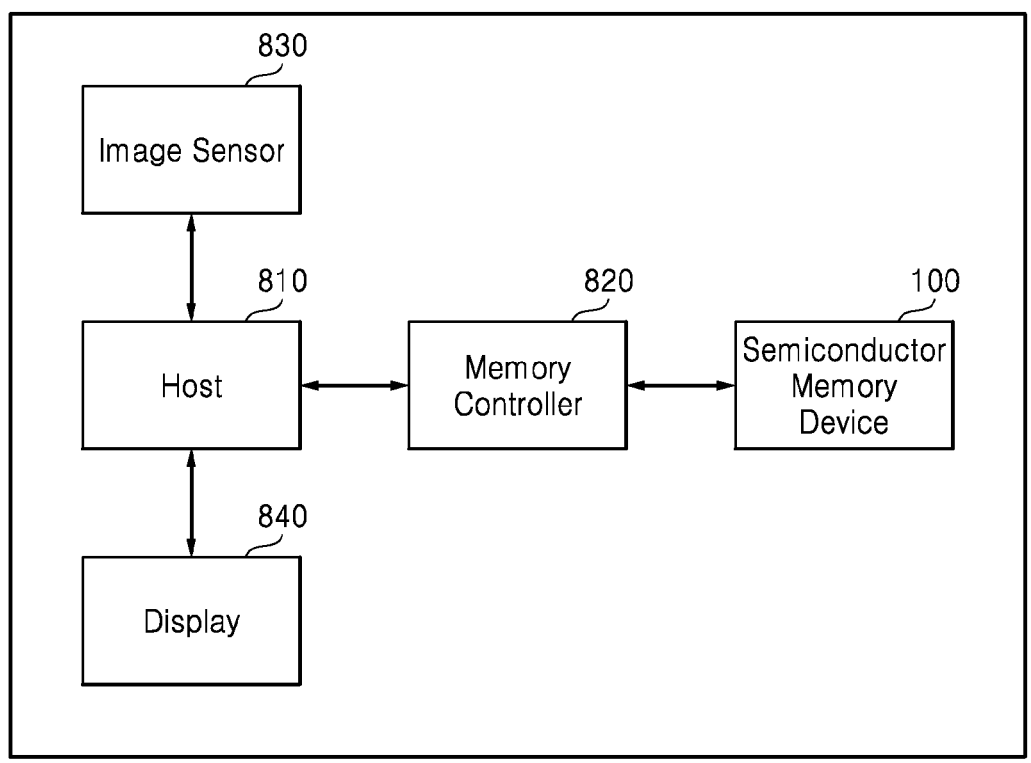
FIG. 11 is a block diagram of yet another computer system including the semiconductor memory device illustrated in FIG. 3 according to another embodiment of the inventions.

FIG. 11 is a block diagram of a computer system 800 including the semiconductor memory device 100 illustrated in FIG. 3 according to another embodiment of the inventions. The computer system 800 may be implemented as an image processor such as, for example, a digital camera, a cellular phone equipped with a digital camera, a smart phone equipped with a digital camera, or a tablet PC equipped with a digital camera.

The computer system 800 includes a host 810, the semiconductor memory device 100 and a memory controller 820 controlling the data processing operations, such as a write operation or a read operation, of the semiconductor memory device 100. The computer system 800 further includes an image sensor 830 and a display 840. The image sensor 830 included in the computer system 800 converts optical images into digital signals and outputs the digital signals to the host 810 or the memory controller 820. The digital signals may be controlled by the host 810 to be displayed through the display 840 or stored in the semiconductor memory device 100 through the memory controller 820.

Data stored in the semiconductor memory device 100 may be displayed through the display 840 according to the control of the host 810 or the memory controller 820. The memory controller 820, which may control the operations of the semiconductor memory device 100, may be implemented as a part of the host 810 or as a separate chip.

Figure 12:
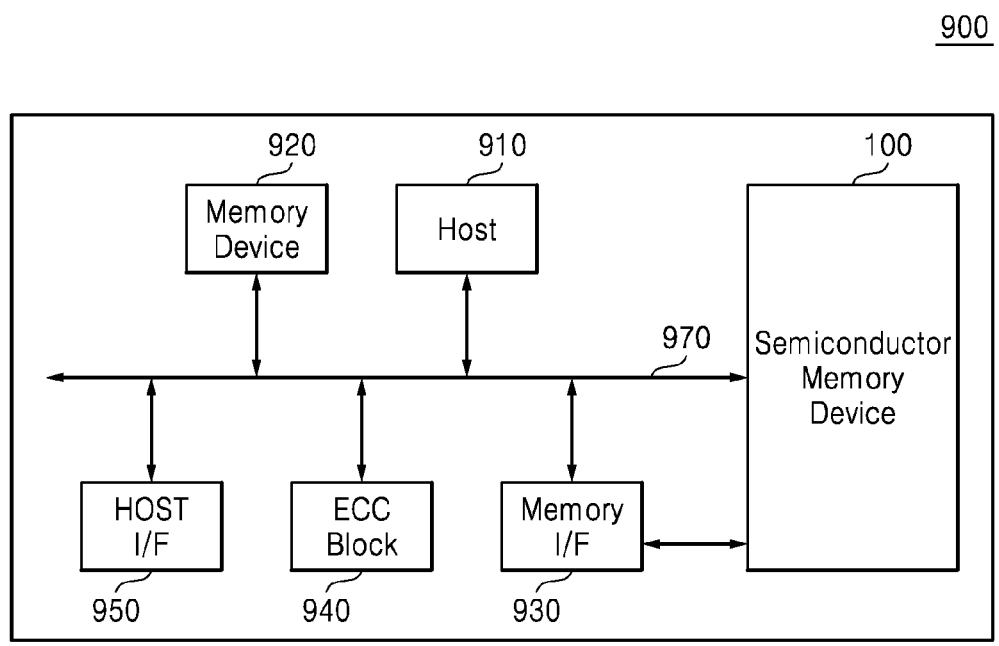
FIG. 12 is a block diagram of still another computer system including the semiconductor memory device illustrated in FIG. 3 according to another embodiment of the inventions.

FIG. 12 is a block diagram of a computer system 900 including the semiconductor memory device 100 illustrated in FIG. 3 according to another embodiment of the inventions. The computer system 900 includes the semiconductor memory device 100 and a host 910 controlling the operations of the semiconductor memory device 100. The computer system 900 also includes a system memory 920, a memory interface 930, an error correction code (ECC) block 940 and a host interface 950.

The system memory 920 may be used as another memory of the host 910 in conjunction with memory device 100. The system memory 920 may be implemented by a non-volatile memory like read-only memory (ROM) or a volatile memory like static random access memory (SRAM). The host 910 connected with the computer system 900 may perform data communication with the semiconductor memory device 100 through the memory interface 930 and the host interface 950.

The ECC block 940 is controlled by the host 910 to detect an error bit included in data output from the semiconductor memory device 100 through the memory interface 930, correct the error bit, and transmit the error-corrected data to the host 910 through the host interface 950. The host 910 may control data communication among the memory interface 930, the ECC block 940, the host interface 950, and the system memory 920 through a bus 970. The computer system 900 may be implemented, for example, as a flash memory drive, a USB memory drive, an IC-USB memory drive, or a memory stick.

Figure 13:
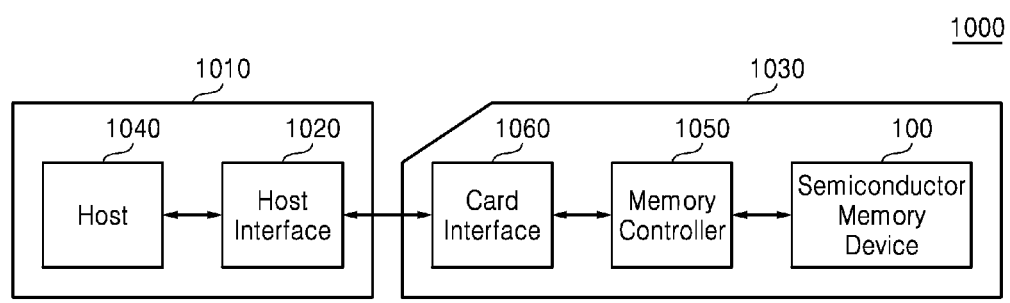
FIG. 13 is a block diagram of yet still another computer system including the semiconductor memory device illustrated in FIG. 3 according to further embodiments of the inventions.

FIG. 13 is a block diagram of a computer system 1000 including a memory card 1030 containing the semiconductor memory device 100 illustrated in FIG. 3 according to further embodiments of the inventions. The computer system 1000 may be implemented as, e.g., a memory card or a smart card. The computer system 1000 includes a host computer 1010 and a memory card 1030. The host computer 1010 includes a host 1040 and a host interface 1020. The memory card 1030 includes the semiconductor memory device 100, a memory controller 1050, and a card interface 1060.

The memory controller 1050 may control data exchange between the semiconductor memory device 100 and the card interface 1060. The card interface 1060 may be a secure digital (SD) card interface or a multi-media card (MMC) interface, but the inventions are not restricted to these disclosed embodiments.

When the memory card 1030 is connected with the host computer 1010, the card interface 1060 may interface a host 1040 and the memory controller 1050 for data exchange according to a protocol of the host 1040. The card interface 1060 may support various protocols such as a universal serial bus (USB) protocol and an inter-chip (IC)-USB protocol. Here, the card interface 1060 may indicate a hardware supporting a protocol used by the host computer 1010, software installed in the hardware, or a signal transmission mode.

When the computer system 1000 is connected with the memory card 1030 coupled to the host interface 1020 of the host computer 1010 such as a PC, a tablet PC, a digital camera, a digital audio player, a cellular phone, a console video game hardware, or a digital set-top box, the host interface 1020 may perform data communication with the semiconductor memory device 100 through the card interface 1060 and the memory controller 1050 according to the control of the host 1040.

Figure 14:
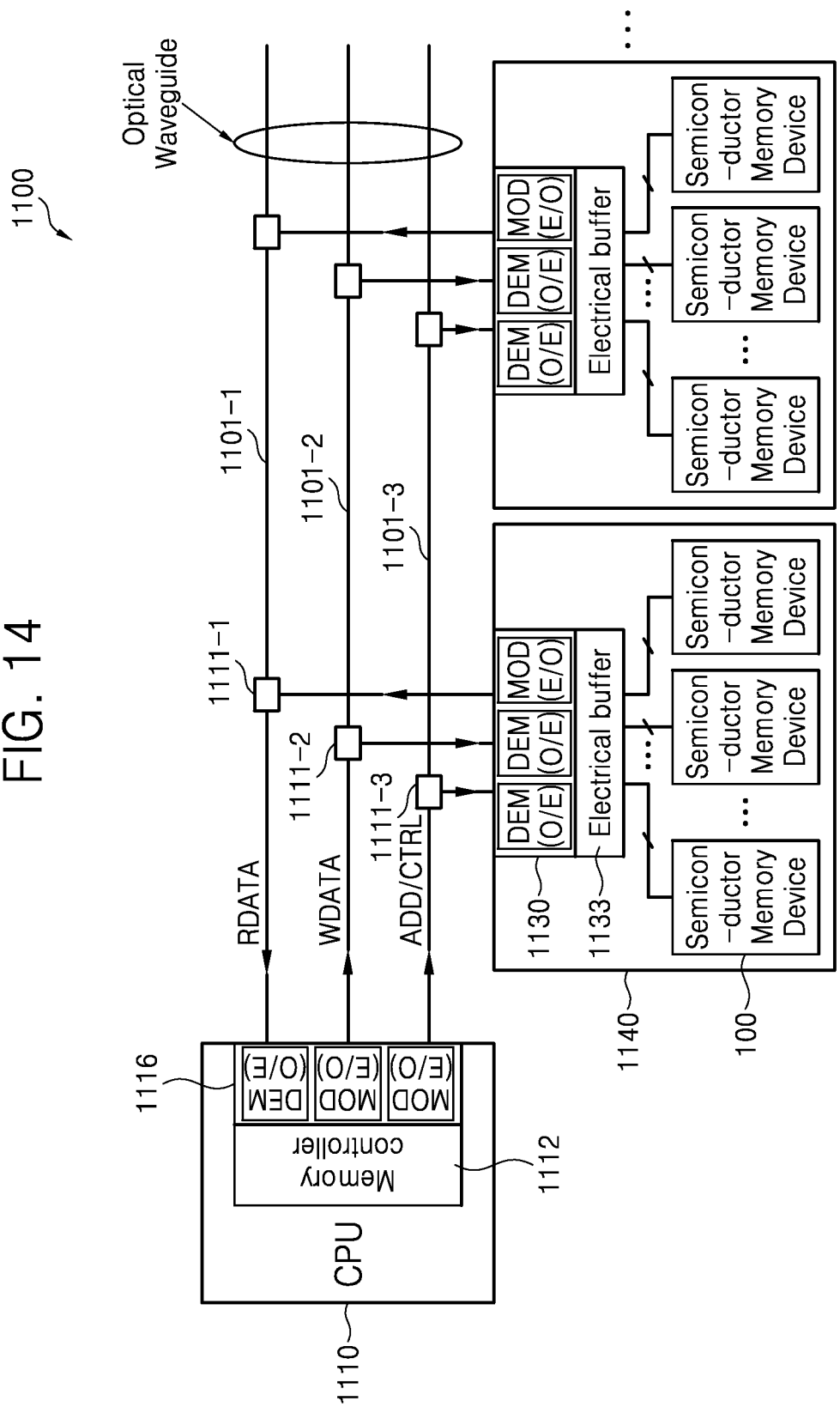
FIG. 14 is a block diagram of a data processing system including the semiconductor memory device illustrated in FIG. 3 according to some embodiments of the inventions.

FIG. 14 is a block diagram of a data processing system 1100 including the semiconductor memory device 100 illustrated in FIG. 3 according to some embodiments of the inventions. In FIG. 14, MOD(E/O) denotes an optical modulator used as an E/O converter to convert electrical signal to optical signal, and DEM(O/E) denotes an optical demodulator used as an O/E converter to convert optical signal to electrical signal. Referring to FIG. 14, the data processing system 1100 includes a central processing unit (CPU) 1110, a plurality of data buses 1101-1, 1101-2, and 1101-3, and a plurality of memory modules 1140.

The memory modules 1140 transmit and receive optical signals through a plurality of couplers 1111-1, 1111-2, and 1111-3 respectively connected to the data buses 1101-1 through 1101-3. Each of the couplers 1111-1 through 1111-3 may be implemented by an electrical coupler or an optical coupler.

The CPU 1110 includes a first optical transceiver 1116, which includes at least one optical modulator MOD(E/O) and at least one optical demodulator DEM(O/E), and a memory controller 1112. The optical demodulator DEM(O/E) is used as an O/E converter. The memory controller 1112 is controlled by the CPU 1110 to control the operations, e.g., the transmitting operation and the receiving operation, of the first optical transceiver 1116.

For instance, during a write operation, a first optical modulator MOD(E/O) of the first optical transceiver 1116 generates a modulated optical signal ADD/CTRL from addresses and control signals, and transmits the optical signal ADD/CTRL to the data bus 1101-3. After the first optical transceiver 1116 transmits the optical signal ADD/CTRL to the data bus 1101-3, a second optical modulator MOD(E/O) of the first optical transceiver 1116 generates modulated optical write data WDATA and transmits the optical write data WDATA to the data bus 1101-2.

Each of the memory modules 1140 includes a second optical transceiver 1130 and a plurality of memory devices 100. Each memory module 1140 may be implemented, for example, by an optical dual in-line memory module (DIMM), an optical fully buffered DIMM, an optical small outline dual in-line memory module (SO-DIMM), an optical registered DIMM (RDIMM), an optical load reduced DIMM (LRDIMM), an optical un-buffered DIMM (UDIMM), an optical micro DIMM, or an optical single in-line memory module (SIMM).

Still referring to FIG. 14, an optical demodulator DEM(O/E) included in the second optical transceiver 1130 demodulates the optical write data WDATA received through the data bus 1101-2 and transmits a demodulated electrical signal to at least one of the memory devices 100.

Each memory module 1140 may also include an electrical buffer 1133 which buffers an electrical signal output from an optical demodulator DEM(O/E). For instance, the electrical buffer 1133 may buffer a demodulated electrical signal and transmit the buffered electrical signal to at least one of the memory devices 100.

During a read operation, an electrical signal output from a memory device 100 is modulated into optical read data RDATA by an optical modulator MOD(E/O) included in the second optical transceiver 1130. The optical read data RDATA is transmitted to a first optical demodulator DEM(O/E) included in the CPU 1110 through the data bus 1101-1. The first optical demodulator DEM(O/E) demodulates the optical read data RDATA and transmits a demodulated electrical signal to the memory controller 1112.

Figure 15:
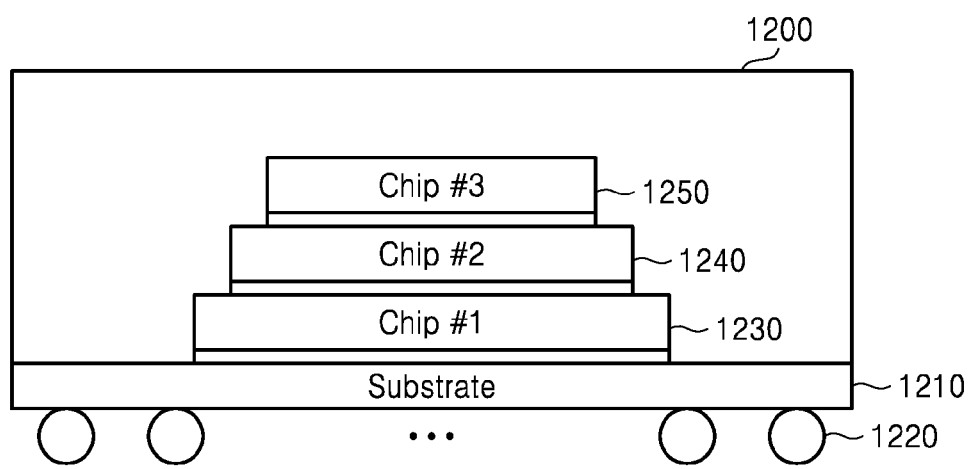
FIG. 15 is a schematic conceptual diagram illustrating a multi-chip package including the semiconductor memory device of FIG. 3 according to an embodiment of the inventions.

FIG. 15 is a schematic diagram illustrating a multi-chip package 1200 including the semiconductor memory device 100 of FIG. 3 according to an embodiment of the inventions.

Referring to FIG. 15, the multi-chip package 1200 may include a plurality of semiconductor devices (chips #1 to #3) 1230 to 1250 that are sequentially stacked on a package substrate 1210. The plurality of semiconductor devices 1230 to 1250 may each include the semiconductor memory device 100 described above. A memory controller (not shown) configured to control an operation of each of the plurality of semiconductor devices 1230 to 1250 may be included in at least one semiconductor device among the plurality of semiconductor devices 1230 to 1250 or may be formed on the package substrate 1210. A through-substrate via (TSV) (not shown), a bonding wire (not shown), a bump (not shown), or a solder ball 1220 may be used to electrically connect the plurality of semiconductor devices 1230 to 1250 with one other.

For example, the first semiconductor device 1230 may be a logic die that includes an input/output interface device and a memory controller, and the second semiconductor device 1240 and the third semiconductor device 1250 may be a die, on which a plurality of memory devices are stacked, and may include a memory cell array. In this case, a memory device of the second semiconductor device 1240 and a memory device of the third semiconductor device 1250 may be the same type of memory devices or different types of memory devices according to various embodiments of the inventions.

As another example, the first to third semiconductor devices 1230 to 1250 may include memory controllers, respectively. In this case, in each of the first to third semiconductor devices 1230 to 1250, the memory controller may be disposed on a die on which the memory cell array is disposed or a die on which the memory cell array is not disposed according to an embodiment of the inventive concept.

As another example, the first semiconductor device 1230 may include an optical interface device. The memory controller may be positioned in the first semiconductor device 1230 or the second semiconductor device 1240, and a memory device may be positioned in the second semiconductor device 1240 or the third semiconductor device 1250 and may be connected to the memory controller via a TSV.

Also, the above embodiments may be each embodied as a hybrid memory cube (HMC) having a stacked structure of a memory controller and a memory cell array die. When the above embodiments are each embodied as an HMC, the bandwidth increases to improve the performance of a memory device and the area of the memory device is minimized, thereby reducing power consumption and manufacturing costs, providing synergistic advantages to go along with the benefits as illustrated by the various embodiments discussed above in the context of FIGS. 1 through 8.

Figure 16:
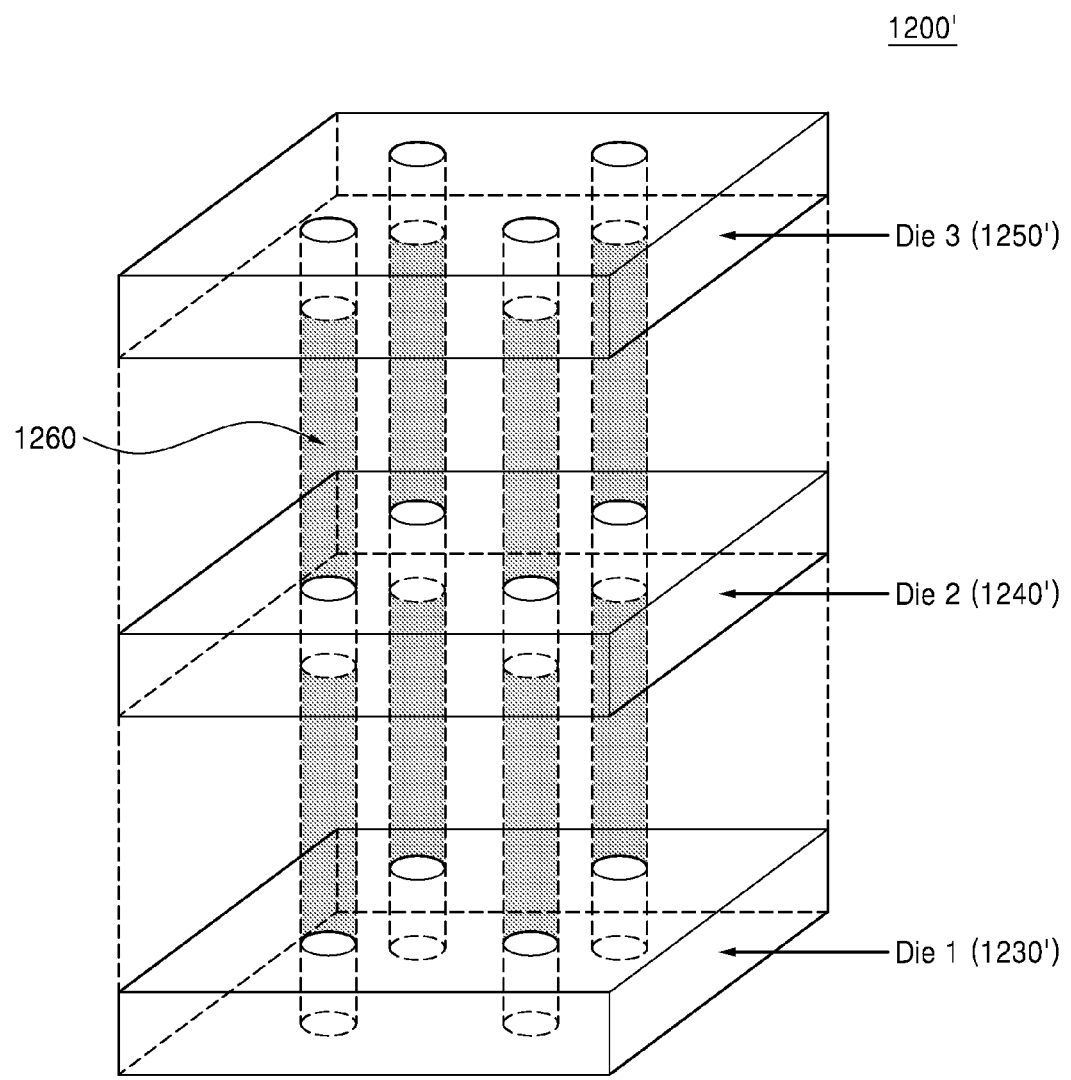
FIG. 16 is a diagram three-dimensionally illustrating the multi-chip package of FIG. 15 according to an embodiment of the inventions.

FIG. 16 is a diagram three-dimensionally illustrating a multi-chip package 1200' such as that shown in FIG. 15 according to an embodiment of the inventions. Referring to FIG. 16, the multi-chip package 1200' includes a stacked structure of a plurality of dies (die1 to die3) 1230' to 1250' connected via TSVs 1260. Each of the dies 1230' to 1250' may include a plurality of circuit blocks (not shown) and a periphery circuit (not shown) to realize functions of the semiconductor memory device 100. The dies 1230' to 1250' may be referred to as cell layers and the plurality of circuit blocks may be embodied as memory blocks.

The TSVs 1260 may be formed of conductive materials including a metal such as copper (Cu) and may be disposed at the center of a silicon substrate. The silicon substrate has a structure covering the TSVs 1260. An insulating region (not shown) may be disposed between the TSVs 1260 and the silicon substrate.

As illustrated by the various embodiments of the inventions, a semiconductor memory device can flexibly and intelligently apply for controlling refresh operations with respect to weak cells including for a redundancy memory cell, thereby improving the performance and reliability of semiconductor memories.

Also, as those of skill will appreciate, there is a wide variety of benefits from the various aspects of the inventions, such as performing of the refresh operation on the repair memory cell may be skipped to reduce power consumption, or integrating improved memory devices with various host systems and memory access architectures to improve overall system performance and reliability, or flexibly incorporating the inventions in a variety of packages.

While the inventive concept has been particularly shown and described with reference to exemplary embodiments thereof, it will be understood that various changes in form and details may be made therein without departing from the spirit and scope of the following claims.

What is claimed is:

1. A semiconductor memory device comprising:
a normal memory cell block including a first plurality of memory cells;
a redundancy memory cell block including a second plurality of memory cells and configured for use in replacing memory cells of the normal memory cell block;
a weak cell information storage configured to store information regarding weak memory cells in the normal and redundancy memory cell blocks; and
a refresh control circuit coupled to the normal and redundancy memory cell blocks and to the weak cell information storage, the refresh control circuit configured to control a refresh rate of memory cells in the normal and redundancy memory cell blocks based on the information regarding weak memory cells in the weak cell information storage, wherein
the weak memory cells in the normal and redundancy memory cell blocks are refreshed at least once more than other memory cells in the normal and redundancy memory cell blocks during a refresh cycle, and wherein the weak cell information storage comprises a plurality of fuses configured to store weak memory cell information entries, the weak memory cell information entry comprising:
- a first field indicating whether the weak memory cell is in the normal memory cell block or the redundancy memory cell block; and
- a second field indicating an address of the weak memory cell.

2. The semiconductor memory device of claim 1, wherein the plurality of fuses comprise a plurality of anti-fuses.

3. The semiconductor memory device of claim 1, further comprising a mode register circuit coupled to the refresh control circuit, and wherein the refresh control circuit is configured to cause a refresh of a weak memory cell based on a specific value of the mode register circuit.

4. The semiconductor memory device of claim 1, further comprising a repair cell information storage coupled to the refresh control circuit, the repair cell information storage configured to store information corresponding to memory cells among the normal memory cell block replaced by memory cells in the redundancy memory cell block.

5. The semiconductor memory device of claim 4, wherein the refresh control circuit further comprises an address controller configured to control outputting of address information based on a comparison of address information obtained using the repair cell information storage with address information obtained using the weak cell information storage.

6. The semiconductor memory device of claim 5, wherein the address controller comprises:
- an address storage configured to receive and store address information corresponding to memory cells obtained from the repair cell information storage;
- a comparator configured to compare the address information corresponding to repair memory cells obtained from the address storage with the address information corresponding to weak memory cells obtained from the weak cell information storage, and to output the comparison result; and
- an address control unit configured to block outputting of the address information when the address information corresponding to a repair memory cell and the address information corresponding to a weak memory cell are the same.

7. The semiconductor memory device of claim 1, wherein the refresh control circuit is configured to control an automatic refresh operation of the semiconductor memory device.

8. A computer system comprising the semiconductor memory device of claim 1.

9. A semiconductor memory device comprising:
- a first plurality of memory cells;
- a second plurality of memory cells configured for use in replacing memory cells of the first plurality of memory cells;
- a repair cell information storage configured to store information regarding memory cells in the first plurality of memory cells replaced by memory cells in the second plurality of memory cells;
- a weak cell information storage configured to store information regarding weak memory cells in the first and second plurality of memory cells; and
- a refresh control circuit coupled to the repair cell information storage, the weak cell information storage, and the first and second plurality of memory cells, the refresh control circuit configured to control a refresh rate of memory cells in the first and second memory plurality of memory cells based on the information regarding weak memory cells in the weak cell information storage, wherein during a refresh cycle, the weak memory cells are refreshed at least once more than other memory cells in the first and second plurality of memory cells, and wherein the refresh control circuit further comprises an address controller configured to control outputting of address information based on a comparison of address information obtained using the repair cell information storage with address information obtained using the weak cell information storage.

10. The semiconductor memory device of claim 9, wherein the weak cell information storage comprises a plurality of fuses configured to store weak memory cell information entries identifying addresses of the weak memory cells.

11. The semiconductor memory device of claim 10, wherein the plurality of fuses comprise a plurality of anti-fuses.

12. The semiconductor memory device of claim 9, further comprising a mode register circuit coupled to the refresh control circuit, and wherein the refresh control circuit is configured to cause a refresh of a weak memory cell based on a specific value of the mode register circuit.

13. The semiconductor memory device of claim 9, wherein the address controller comprises:
- an address storage configured to receive and store address information corresponding to memory cells obtained from the repair cell information storage; and
- a comparator configured to compare the address information corresponding to repair memory cells obtained from the address storage with the address information corresponding to weak memory cells obtained from the weak cell information storage.

14. A method of operating a semiconductor memory device having a first plurality of memory cells, a second plurality of memory cells configured for use in replacing memory cells of the first plurality of memory cells, a weak cell information storage configured to store information regarding weak memory cells in the first and second plurality of memory cells, and a refresh control circuit, the method comprising:
- receiving and storing address information corresponding to memory cells in the first plurality of memory cells replaced by memory cells in the second plurality of memory cells;
- providing a refresh command to the refresh control circuit;
- determining an address value based on the refresh command;
- determining whether the address value corresponds to a memory cell in the first plurality of memory cells replaced by a memory cell in the second plurality of memory cells;
- determining whether the address value corresponds to a weak memory cell based on information from the weak cell information storage; and
- refreshing the memory cell corresponding to the address value more than once during a refresh cycle if the address value corresponds to the weak memory cell; and
- blocking an operation of the refresh control circuit when the address value determined based on the refresh command is the same as the stored information.

15. The method of claim 14, wherein the refreshing the memory cell corresponding to the address value more than once during the refresh cycle if the address value corresponds to the weak memory cell comprises utilizing a leveraging control signal generated based on information from the weak cell information storage.

16. The method of claim 14, wherein the step of receiving and storing address information corresponding to memory cells in the first plurality of memory cells replaced by memory cells in the second plurality of memory cells is performed during a power-up operation of the semiconductor memory device.

17. The method of claim 16, further comprising blocking an operation of the refresh control circuit when an address information of the weak memory cells is the same as the stored address information.

* * * * *